(12) United States Patent
Chien et al.

(10) Patent No.: US 9,431,446 B2
(45) Date of Patent: Aug. 30, 2016

(54) MECHANISMS FOR FORMING IMAGE SENSOR DEVICE

(71) Applicant: TAIWAN SEMICONDUCTOR MANUFACTURING CO., LTD., Hsin-Chu (TW)

(72) Inventors: Volume Chien, Tainan (TW); Fu-Cheng Chang, Tainan (TW); Yi-Hsing Chu, Tainan (TW); Shiu-Ko Jangjian, Tainan (TW); Chi-Cherng Jeng, Tainan (TW)

(73) Assignee: TAIWAN SEMICONDUCTOR MANUFACTURING CO. LTD., Hsin-Chu (TW)

( * ) Notice: Subject to any disclaimer, the term of this patent is extended or adjusted under 35 U.S.C. 154(b) by 94 days.

(21) Appl. No.: 14/135,042

(22) Filed: Dec. 19, 2013

(65) Prior Publication Data

US 2015/0179690 A1 Jun. 25, 2015

(51) Int. Cl.
*H01L 27/14* (2006.01)
*H01L 27/146* (2006.01)

(52) U.S. Cl.
CPC ....... *H01L 27/1463* (2013.01); *H01L 27/1464* (2013.01)

(58) Field of Classification Search
None
See application file for complete search history.

(56) References Cited

U.S. PATENT DOCUMENTS

| | | | |
|---|---|---|---|
| 2005/0151212 A1* | 7/2005 | Hong | H01L 27/0629 257/413 |
| 2010/0025790 A1* | 2/2010 | Jang | H01L 27/14603 257/432 |
| 2011/0063486 A1* | 3/2011 | Saeki | H01L 27/14603 348/294 |
| 2011/0254115 A1* | 10/2011 | Shih | H01L 27/14629 257/432 |
| 2013/0084660 A1* | 4/2013 | Lu | H01L 31/1864 438/14 |

* cited by examiner

*Primary Examiner* — Benjamin Sandvik
*Assistant Examiner* — Herve Assouman
(74) *Attorney, Agent, or Firm* — Birch, Stewart, Kolasch & Birch, LLP

(57) ABSTRACT

Embodiments of mechanisms for forming an image sensor device are provided. The image sensor device includes a semiconductor substrate and an isolation structure in the semiconductor substrate. The image sensor device also includes an active region in the semiconductor substrate and surrounded by the isolation structure. The active region includes a light sensing region and a doped region, and the doped region has a horizontal length and a vertical length. A ratio of the horizontal length to the vertical length is in a range from about 1 to about 4.

20 Claims, 9 Drawing Sheets

MECHANISMS FOR FORMING IMAGE SENSOR DEVICE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are developed.

Along with the advantages from reducing geometry size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the intensity of the light is, the higher the charge is accumulated in the pixel array. The accumulated charge is used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices with smaller and smaller sizes.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
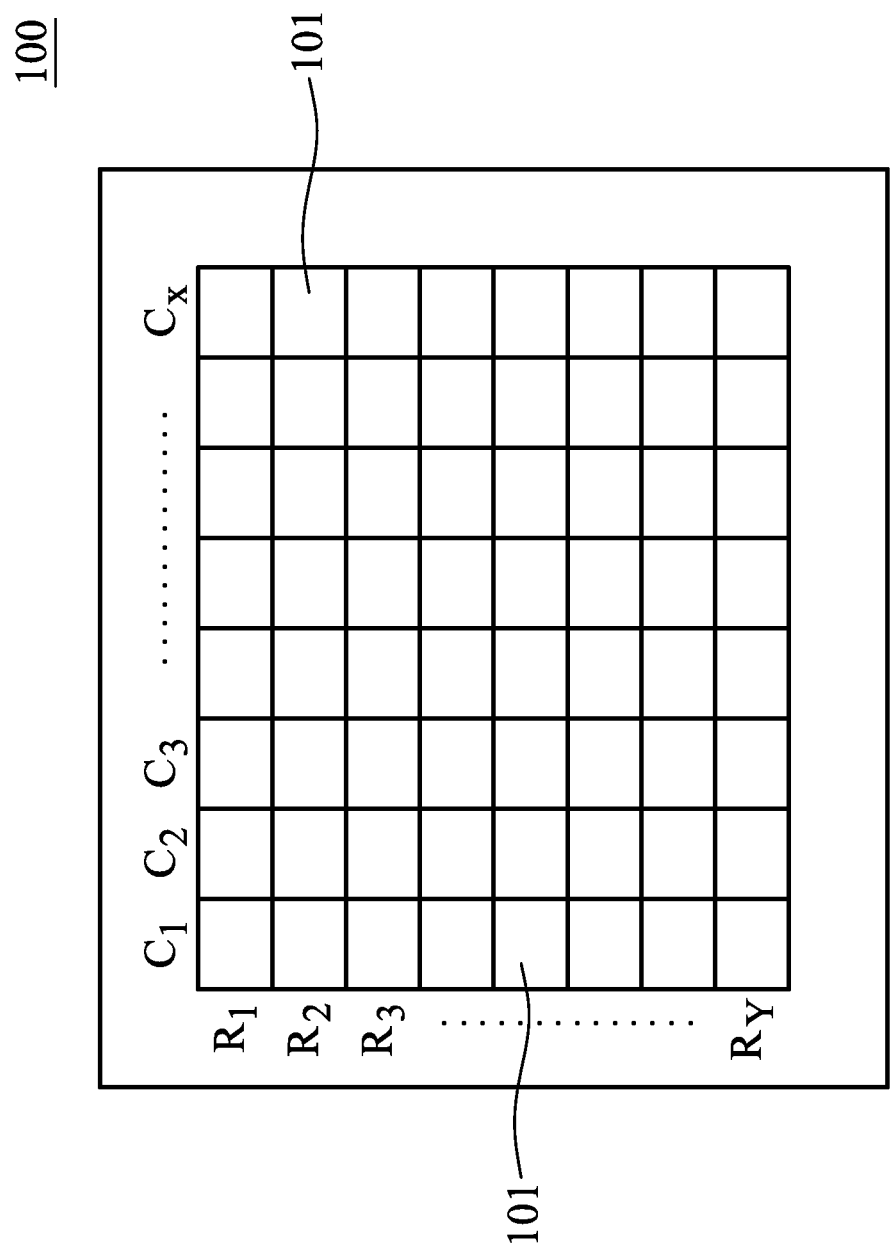
FIG. 1 is a top view of an image sensor device, in accordance with some embodiments.

FIG. 1 is a top view of an image sensor device 100, in accordance with some embodiments. The image sensor device 100 may be a backside illuminated (BSI) image sensor device. However, it should be appreciated that embodiments of the disclosure are not limited to being the BSI image sensor device. In some other embodiments, the image sensor device 100 is a front side illuminated (FSI) image sensor device.

In some embodiments, the image sensor device 100 includes an array of pixel regions 101. The pixel regions 101 may be arranged into columns (for example, $C_1$ to $C_X$) and rows (for example, $R_1$ to $R_Y$). The term "pixel region" refers to a unit cell containing features such as photodetector and various circuitry. The unit cell may include various semiconductor devices for converting electromagnetic radiation into an electrical signal. The photodetectors in the pixel regions 101 may include photodiodes, complimentary metal-oxide-semiconductor (CMOS) image sensors, charged coupling device (CCD) sensors, active sensors, passive sensors, other applicable sensors, or a combination thereof.

The pixel regions 101 may be designed having various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs may be formed in a peripheral region of the image sensor device 100 and be coupled to the pixel regions 101. The circuitry in the peripheral region provides an operation environment for the pixel regions 101 and support communications with the pixel regions 101.

Figure 2A:
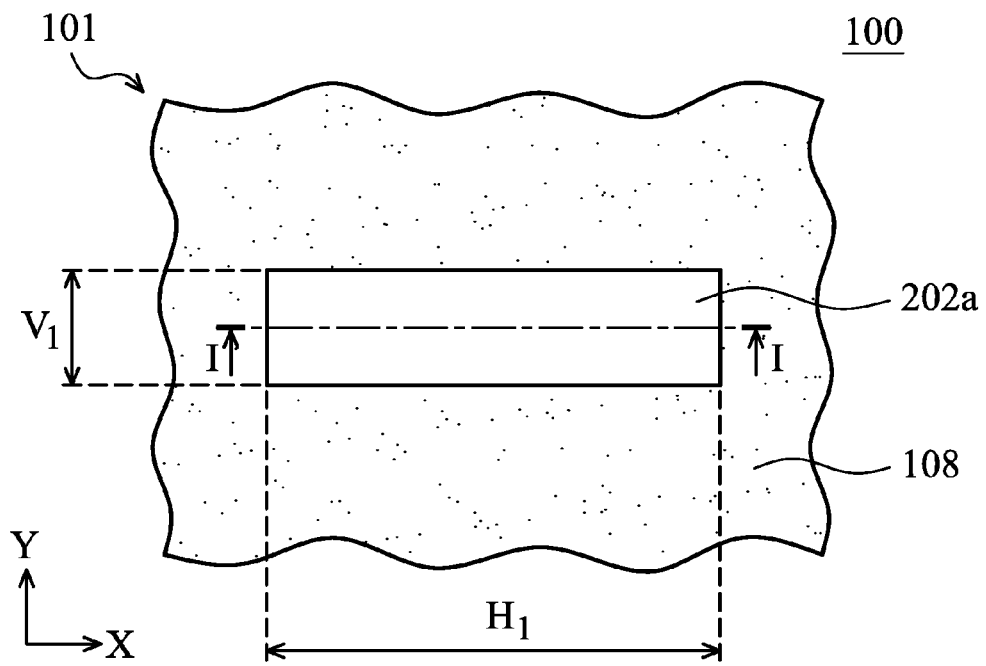
FIG. 2A is an enlarged top view of a pixel region of an image sensor device, in accordance with some embodiments.

FIG. 2A is an enlarged top view of a pixel region 101 of an image sensor device 100, in accordance with some embodiments. The image sensor device 100 includes a semiconductor substrate (not shown) with an isolation structure 108 formed in the semiconductor substrate. As shown in FIG. 2A, the isolation structure 108 surrounds and defines an active region 202a of the semiconductor substrate, in accordance with some embodiments. The isolation structure 108 may also surround and define a light sensing region (not shown) formed in the semiconductor substrate. In some other embodiments, the active region 202a includes the light sensing region. In some embodiments, the active region 202a is to be formed with a number of devices, such as transistors, diodes, other suitable devices, or a combination thereof.

As shown in FIG. 2A, the active region 202a has a length $H_1$ and a length $V_1$. In some embodiments, the length $H_1$ is along a horizontal axis X, and the length $V_1$ is along a vertical axis Y. Therefore, the lengths $H_1$ and $V_1$ are also called horizontal length and vertical length, respectively. In some embodiments, the length $H_1$ is a maximum length of the active region 202a along a first direction (such as along the horizontal axis X), and the length $V_1$ is a maximum length of the active region 202a along a second direction (such as the vertical axis Y). The active region 202a may be rectangular in shape or substantially rectangular in shape. In some embodiments, the length $H_1$ is greater than the length $V_1$. A ratio of the length $H_1$ to the length $V_1$ ($H_1/V_1$) may be higher than about 6.

Figure 2B:
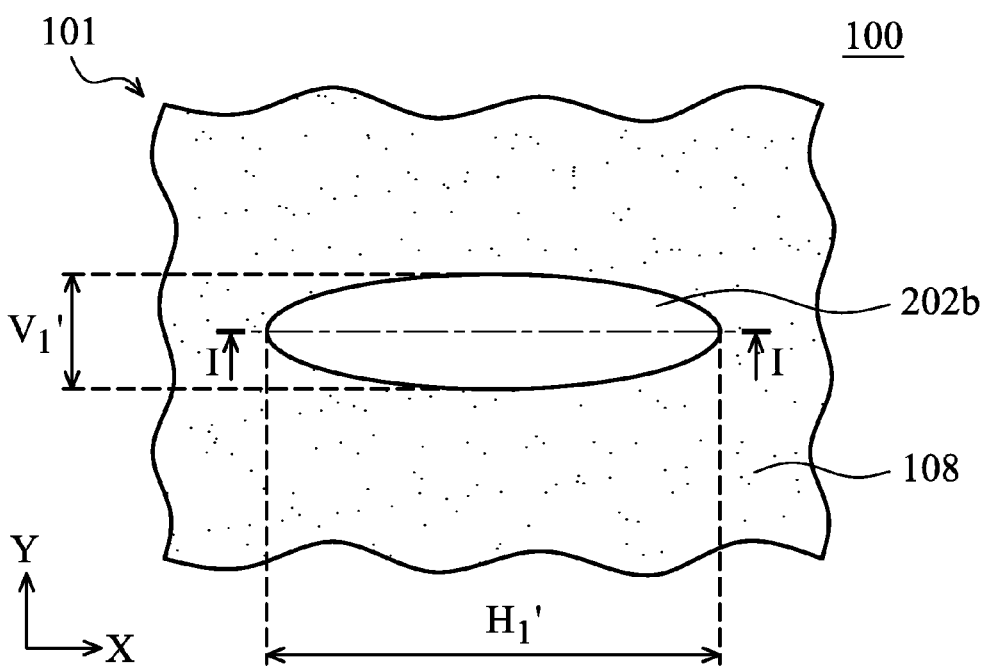
FIG. 2B is an enlarged top view of a pixel region of an image sensor device, in accordance with some embodiments.

The active region defined by the isolation structure 108 is not limited to being rectangular in shape. FIG. 2B is an enlarged top view of a pixel region 101 of an image sensor device 100, in accordance with some embodiments.

As shown in FIG. 2B, an active region 202b surrounded and defined by the isolation structure 108 is elliptical (or substantially elliptical) in shape, in accordance with some embodiments. The active region 202b has a length $H_1'$ and a length $V_1'$. In some embodiments, the length $H_1'$ is a maximum length of the active region 202b along a first direction (such as along the horizontal axis X), and the length $V_1'$ is a maximum length of the active region 202b along a second direction (such as the vertical axis Y). In some embodiments, the length $H_1'$ is greater than the length $V_1'$. A ratio of the length $H_1'$ to the length $V_1'$ ($H_1'/V_1'$) may be higher than about 6.

It should be appreciated, however, that the active region is not limited to being rectangular or elliptical in shape. The active region surrounded and defined by the isolation structure 108 may have a variety of shapes.

Figure 3A:
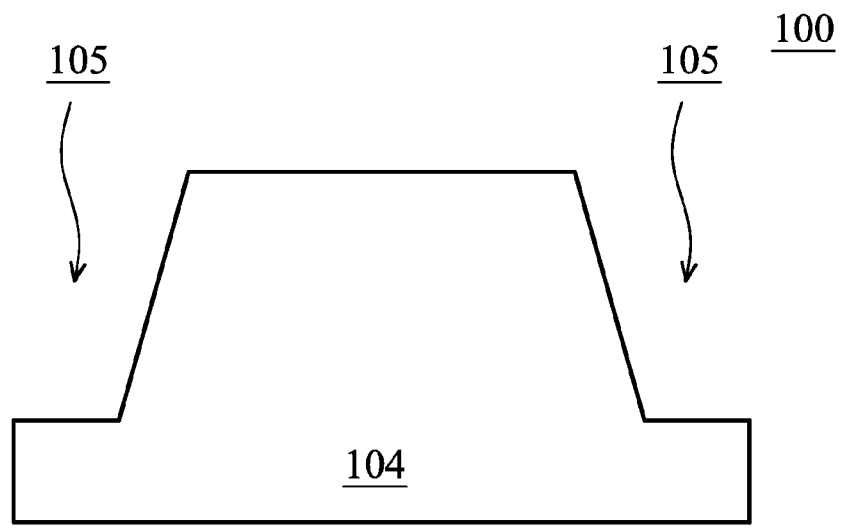
FIGS. 3A-3C are cross-sectional views of various stages of a process for forming an image sensor device, in accordance with some embodiments.
Figure 3B:
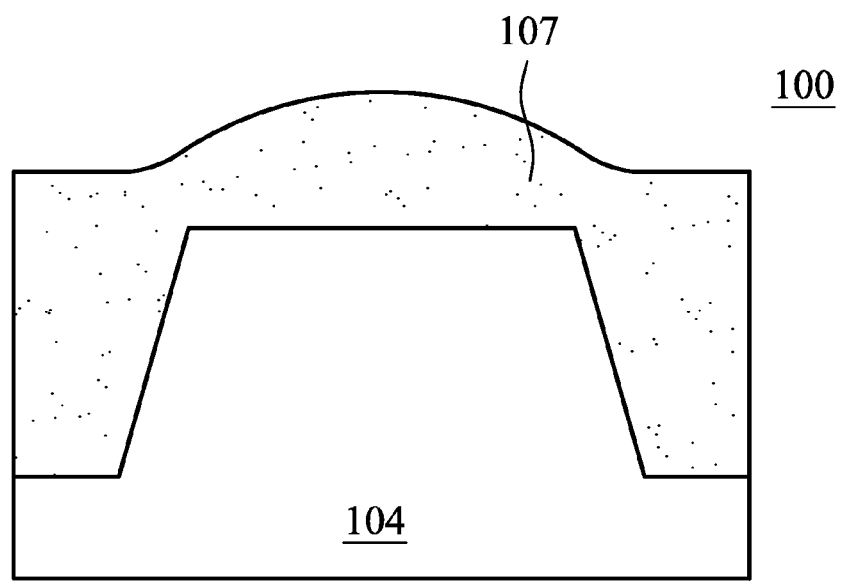
Figure 3C:
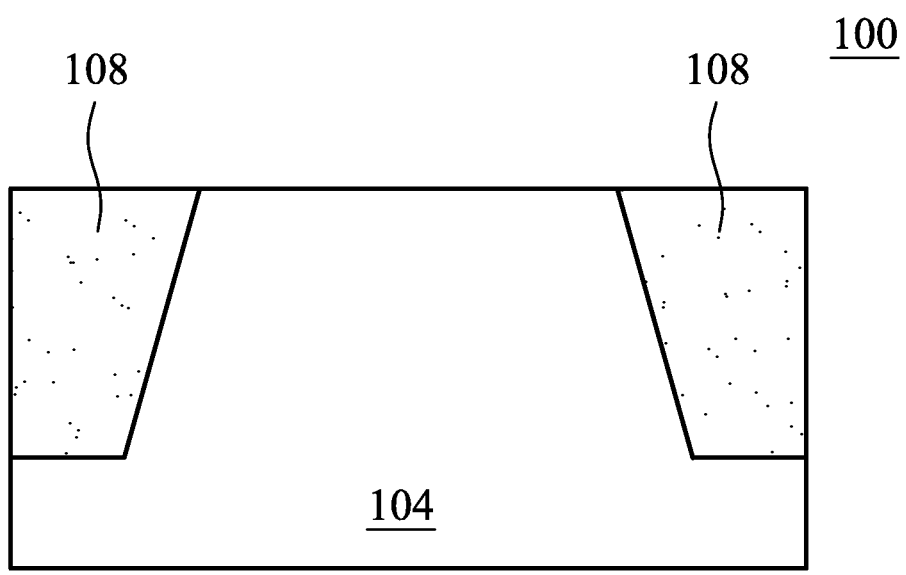

FIGS. 3A-3C are cross-sectional views of various stages of a process for forming an image sensor device 100, in accordance with some embodiments. For example, FIGS. 3A-3C are cross-sectional views taken along the line I-I in FIG. 2A or FIG. 2B. FIGS. 3A-3C illustrate the formation of the isolation structure 108 of the image sensor device 100 in some embodiments.

As shown in FIG. 3A, a semiconductor substrate 104 is provided, in accordance with some embodiments. The semiconductor substrate 104 may be a semiconductor wafer (such as a silicon wafer) or a portion of a semiconductor wafer. In some embodiments, the semiconductor substrate 104 includes an elementary semiconductor material including silicon or germanium in a single crystal, polycrystal, or amorphous structure. In some other embodiments, the semiconductor substrate 104 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. Alternatively, the semiconductor substrate 104 may include multi-layer semiconductors, semiconductor on insulator (SOI) (such as silicon on insulator or germanium on insulator), or a combination thereof.

As shown in FIG. 3A, a portion of the semiconductor substrate 104 is removed to form one or more recesses 105 in the semiconductor substrate 104, in accordance with some embodiments. Photolithography and etching processes may be performed to form the recesses 105. In some embodiments, the recesses 105 are trenches. The recesses 105 may connect with each other. The recesses 105 extend into the semiconductor substrate 104 from a surface of the semiconductor substrate 104.

As shown in FIG. 3B, a dielectric layer 107 is deposited over the semiconductor substrate 104 to fill the recesses 105, in accordance with some embodiments. The dielectric layer 107 may be made of silicon oxide, silicon nitride, silicon oxynitride, fluoride-doped silicate glass (FSG), a low-K dielectric material, other suitable materials, or a combination thereof. The dielectric layer 107 may be deposited by using a chemical vapor deposition (CVD) process, a thermal oxidation process, a spin-on process, a physical vapor deposition (PVD) process, other applicable processes, or a combination thereof. The dielectric layer 107 may overfill the recesses 105 and cover the surface of the semiconductor substrate 104.

As shown in FIG. 3C, the portion of the dielectric layer 107 outside of the recesses 105 is removed so as to form the isolation structure 108, in accordance with some embodiments. Also referring to FIG. 2A or 2B, the isolation structure 108 surrounds and defines an active region 202a or 202b in the semiconductor substrate 104 in some embodiments. A suitable planarization process may be used to remove the dielectric layer 107 outside of the recesses 105. The suitable planarization process may include a chemical mechanical polishing (CMP) process, a grinding process, an etching process, other applicable processes, or a combination thereof.

In some embodiments, during the planarization process, a high stress is applied over the active region. For example, a CMP process is used as the planarization process. The CMP process involves holding the semiconductor substrate 104 to engage the surface of the dielectric layer 107 with a rotating polishing pad. Studies show that defects, such as dislocations, may be formed in the active region after the planarization process. Since the ratio of $H_1/V_1$ or $H_1'/V_1'$ of the active region is high, a high bending moment may be applied to the active region and concentrate at a middle region of the active region during the planarization process. As a result, the high bending moment may induce the formation of the defects, such as the dislocations, in the active region. The defects, such as the dislocations, may result in dark current and/or white pixel defects. The dark current may decrease signal-to-noise ratios for the image sensor device 100. The quality and performance of the image sensor device 100 are therefore negatively affected.

Since the feature size continues to shrink, the problems mentioned above are exacerbated in some embodiments. Therefore, it is desirable to find alternative mechanisms for forming an image sensor device to resolve or reduce the problems mentioned above.

Figure 4A:
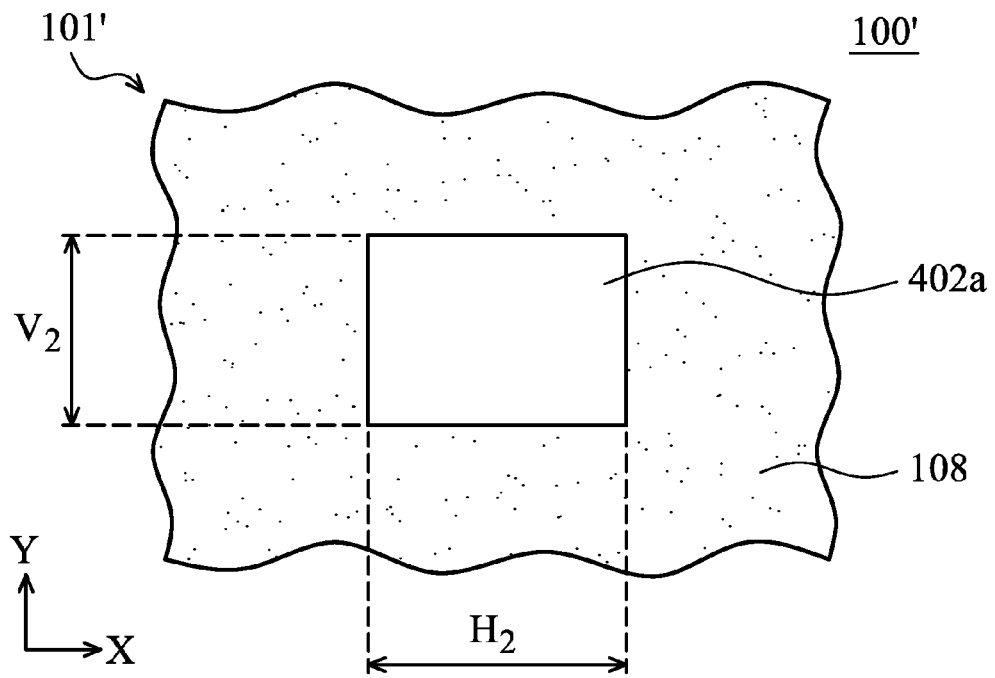
FIG. 4A is an enlarged top view of a pixel region of an image sensor device, in accordance with some embodiments.

FIG. 4A is an enlarged top view of a pixel region 101' of an image sensor device 100', in accordance with some embodiments. As shown in FIG. 4A, a structure similar to that shown in FIG. 2A is provided. An active region 402a is surrounded and defined by the isolation structure 108. The active region 402a has a length $H_2$ and a length $V_2$. In some embodiments, the length $H_2$ is along a horizontal axis X, and the length $V_2$ is along a vertical axis Y. Therefore, the lengths $H_2$ and $V_2$ are also called a horizontal length and a vertical length, respectively. In some embodiments, the length $H_2$ is a maximum length of the active region 402a along a first direction (such as along the horizontal axis X), and the length $V_2$ is a maximum length of the active region 402a along a second direction (such as the vertical axis Y). The first direction and the second direction may be substantially perpendicular to each other. The active region 402a may be rectangular in shape or substantially rectangular in shape. In some embodiments, the length $H_2$ is greater than the length $V_2$. In some other embodiments, the length $H_2$ is substantially equal to the length $V_2$. In these cases, the active region 402a is square (or substantially square) in shape.

In some embodiments, the shape of the active region 402a is modified such that a ratio of the length $H_2$ to the length $V_2$ ($H_2/V_2$) is in a suitable range. The ratio of the length $H_2$ to the length $V_2$ ($H_2/V_2$) may be in a range from about 1 to about 4. In some other embodiments, the ratio ($H_2/V_2$) is about 5. The ratio $H_2/V_2$ is tuned to be less than about 6, such as in the range from about 1 to about 4. Therefore, the bending moment, caused during the planarization process for forming the isolation structure 108, is significantly reduced. There is no unacceptable stress concentrated at a middle region of the active region 402a. Defects such as dislocation are reduced or prevented from forming in the active region 402a. Therefore, dark current is significantly reduced. The quality and performance of the image sensor device 100' are improved accordingly.

Figure 4B:
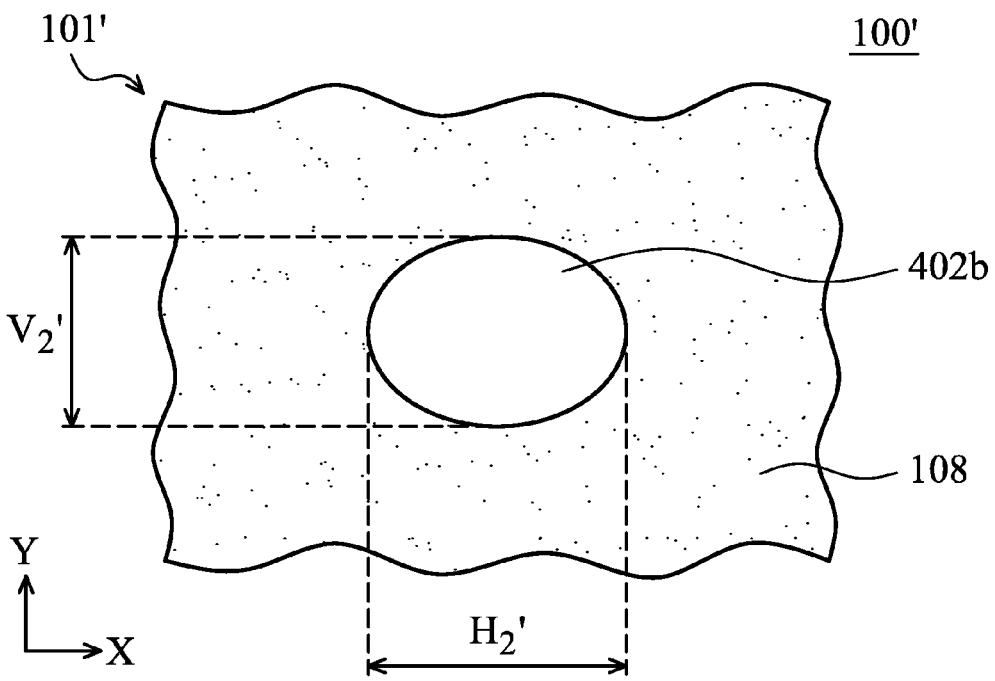
FIG. 4B is an enlarged top view of a pixel region of an image sensor device, in accordance with some embodiments.

Embodiments of the disclosure are not limited to the active region that is rectangular or square in shape. FIG. 4B is an enlarged top view of a pixel region 101' of an image sensor device 100', in accordance with some embodiments.

As shown in FIG. 4B, an active region 402b surrounded and defined by the isolation structure 108 is elliptical (or substantially elliptical) in shape, in accordance with some embodiments. The active region 402b has a length $H_2'$ and a length $V_2'$. In some embodiments, the length $H_2'$ is a maximum length of the active region 402b along a first direction (such as along the horizontal axis X), and the length $V_2'$ is a maximum length of the active region 402b along a second direction (such as the vertical axis Y). The first direction and the second direction may be substantially perpendicular to each other. In some embodiments, the length $H_2'$ is greater than the length $V_2'$. The lengths $H_2'$ and $V_2'$ may be modified to prevent high stress from being applied on the active region during the planarization process for forming the isolation structure 108. A ratio of the length $H_2'$ to the length $V_2'$ ($H_2'/V_2'$) may be in a range from about 1 to about 4. In some other embodiments, the ratio ($H_2'/V_2'$) is about 5. Similarly, because the shape of the active region 402b is modified, defects including, for example, dislocations are significantly prevented from forming in the active region 402b. As a result, the quality and performance of the image sensor device 100 are improved.

The active region surrounded by the isolation structure 108 may have a variety of regions, such as a light sensing region and various doped regions. Each of the regions may be modified to prevent defect formation after the planarization process.

Figure 5:
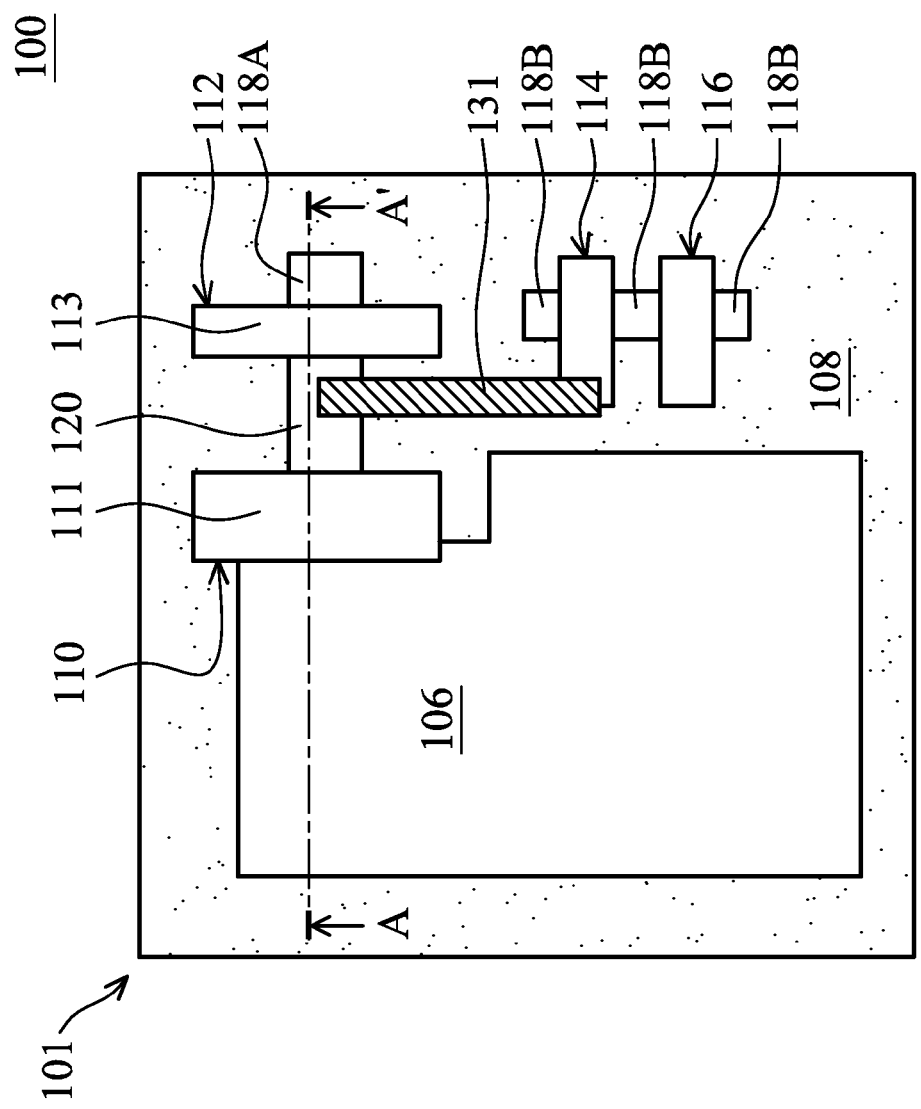
FIG. 5 is a top view of a pixel region of an image sensor device, in accordance with some embodiments.

FIG. 5 is a top view of a pixel region 101 of an image sensor device 100, in accordance with some embodiments. As shown in FIG. 5, the pixel region 101 includes a light sensing region 106. The light sensing region 106 may be used as a photodetector. In some embodiments, the light sensing region 106 includes a photodiode for recording intensity or brightness of light (radiation). The pixel region 101 may contain various transistors. In some embodiments, the transistors include a transfer transistor 110, a reset transistor 112, a source-follower transistor 114, a select transistor 116, other suitable transistors, or a combination thereof. In some embodiments, one or some of the transistors mentioned above are not formed. In some other embodiments, one or more other suitable devices such as transistors are further formed in the pixel region 101.

The pixel region 101 may include various doped regions formed in the semiconductor substrate, such as doped regions 118A, 118B, and 120. The doped regions 118A, 118B, and 120 serve as source/drain regions of the previously mentioned transistors. The doped region 120 is also referred to as a floating diffusion region in some embodiments. The doped region 120 is between the transfer transistor 110 and the reset transistor 112, and is one of the source/drain regions for the transfer transistor 110 and the reset transistor 112. As shown in FIG. 5, the transfer transistor 110 includes a gate stack 111 over a channel region between the doped region 120 and the light sensing region 106 in some embodiments. The reset transistor 112 includes a gate stack 113 over a channel region between the doped regions 120 and 118A. In some embodiments, a conductive feature 131 overlaps a portion of a gate stack of the source-follower transistor 114 and connects to the doped region 120. As shown in FIG. 5, the isolation structure 108 is formed in the pixel region 101 to isolate devices or regions formed in the semiconductor substrate.

The image sensor device 100 further includes a color filter (not shown) and a lens (not shown) positioned over a back surface of the semiconductor substrate. The color filter and the lens are aligned with the light sensing region 106. In the operation of the image sensor device 100 according to some embodiments, the image sensor device 100 is designed to receive radiation traveling towards the back surface of the semiconductor substrate. The lens disposed over the back surface of the semiconductor substrate directs the incident radiation to the corresponding light sensing region 106 in the semiconductor substrate. The incident radiation generates electron-hole pairs. When exposed to the incident radiation, the light sensing region 106 responds to the incident radiation by accumulating electrons. The holes may be trapped by a doped layer over the back surface of the semiconductor substrate to prevent the re-combination of the electrons and the holes.

In some embodiments, the electrons are transferred from the light sensing region 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics (not shown). The reset transistor 112 may act as a switch to reset the doped region 120. When the reset transistor 112 is turned on, the doped region 120 is connected to a power supply to clear all accumulated electrons.

Figure 6:
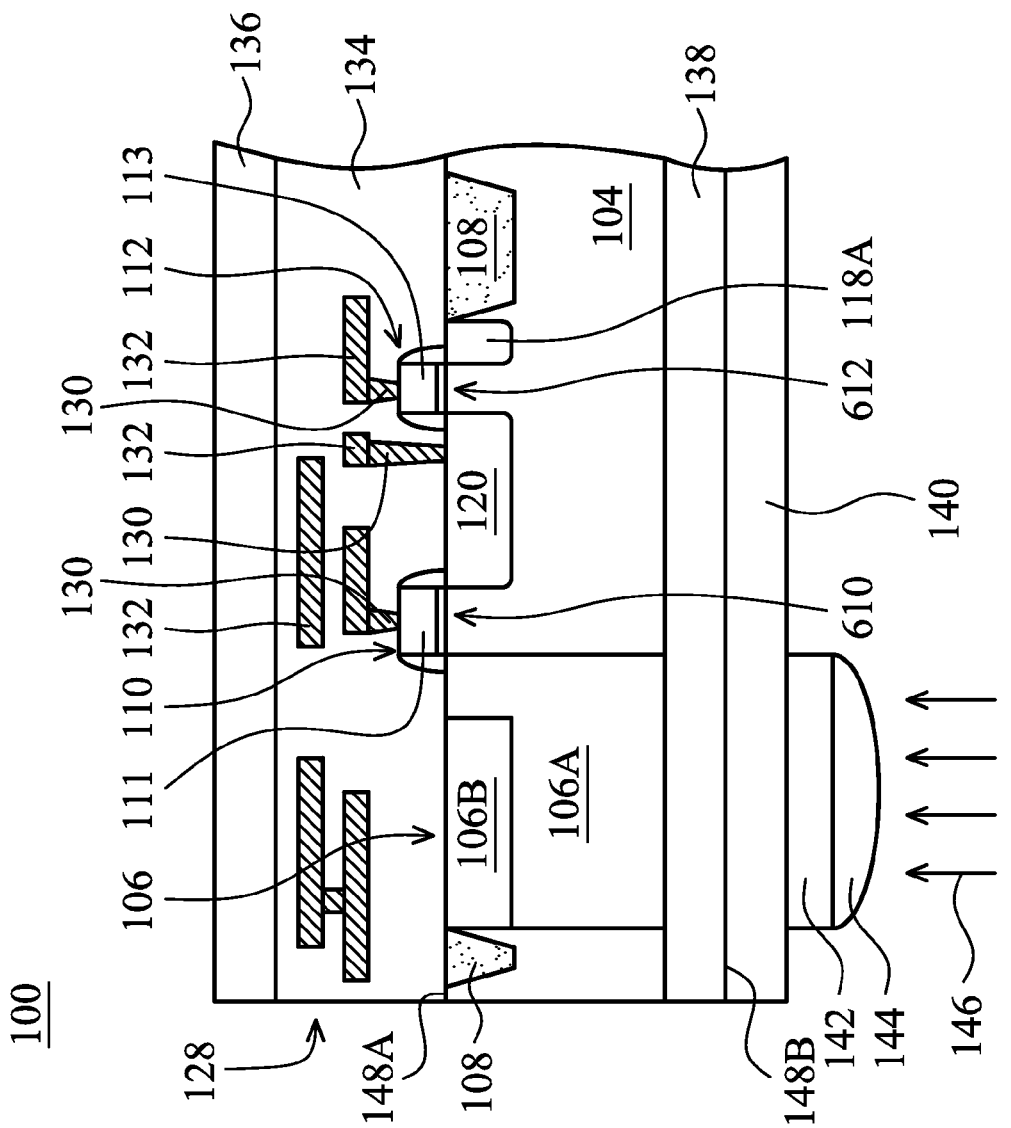
FIG. 6 is a cross-sectional view of an image sensor device, in accordance with some embodiments.

FIG. 6 is a cross-sectional view of the pixel region of the image sensor device 100 along the line A-A' in FIG. 5, in accordance with some embodiments. The image sensor device 100 includes the semiconductor substrate 104 having a front surface 148A and a back surface 148B. In some embodiments, the semiconductor substrate 104 is a p-type doped substrate. P-type dopants, that the semiconductor substrate 104 is doped with, include boron, gallium, indium, other suitable p-type dopants, or a combination thereof. The semiconductor substrate 104 may alternatively be an n-type doped substrate. N-type dopants, which the semiconductor substrate 104 is doped with, include phosphorus, arsenic, other suitable n-type dopants, or a combination thereof. Doping may be implemented using a process, such as ion implantation or diffusion, in various operations and techniques. In the following examples, a p-type doped substrate is taken as an example of the semiconductor substrate 104 for description.

As shown in FIGS. 5 and 6, the pixel region 101 includes the light sensing region 106. The light sensing region 106 may be a photodiode that includes a doped region 106A and a pinned layer 106B. The doped region 106A is formed along the front surface 148A of the semiconductor substrate 104. In some embodiments, the doped region 106A is an n-type doped region. Accordingly, the pinned layer 106B is a p-type doped layer formed overlapping the doped region 106A at the front surface 148A of the semiconductor substrate 104. In some other embodiments, the doped region 106A is a p-type doped region while the semiconductor substrate 104 is an n-type doped substrate.

In some embodiments, the pixel region 101 includes various transistors, such as the transfer transistor 110, the reset transistor 112, the source-follower transistor 114 (shown in FIG. 5), and the select transistor 116 (shown in FIG. 5). Each transistor has a corresponding gate stack formed over the front surface 148A of the semiconductor substrate 104. For example, the transfer transistor 110 has the gate stack 111, and the reset transistor 112 has the gate stack 113. The gate stack 111 of the transfer transistor 110 may overlay a portion of the doped region 106A. The gate stack 111 may also cover a channel region 610 of the transfer transistor 110. The gate stack 113 of the reset transistor 112 may overlay a portion of the doped region 120 and a portion of the doped region 118A. The gate stack 113 may also cover a channel region 612 of the reset transistor 112.

The gate stack of each transistor includes a gate dielectric layer and a gate electrode layer (not shown). The gate dielectric layer may be made of a dielectric material, such as silicon oxide, a high-k dielectric material, other dielectric material, or combinations thereof. Examples of the high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, or a combination thereof. The gate electrode layer may include polysilicon or metal materials. The gate stack may further include main spacers.

The image sensor device 100 further includes a multilayer interconnect (MLI) 128 formed over the front surface 148A of the semiconductor substrate 104, as shown in FIG. 6 in accordance with some embodiments. The MLI 128 is coupled to various components of the image sensor device 100, such as the light sensing region 106. Therefore, the various components of the image sensor device 100 are operable to properly respond to illuminated light (imaging radiation).

The MLI 128 includes various conductive features, which may be vertical interconnects 130, such as contacts and/or vias, and horizontal interconnects 132, such as lines. The interconnect 132 may include the conductive feature 131 as shown in FIG. 5. The various interconnects 130 and 132 are made of conductive materials, such as aluminum, copper, titanium, titanium nitride, tungsten, polysilicon, metal silicide, other applicable materials, or a combination thereof.

The interconnects 130 and 132 of the MLI 128 are embedded in an interlayer dielectric (ILD) structure 134. The ILD structure 134 may have a multilayer structure. The ILD structure 134 may be made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, polyimide, other suitable materials, or a combination thereof.

In some embodiments, a carrier substrate 136 is positioned over the front surface 148A of the semiconductor substrate 104. In some embodiments, the carrier substrate 136 is bonded to the MLI 128. The carrier substrate 136 may be made of a semiconductor material, such as silicon. Alternatively, the carrier substrate may be made of glass or quartz. The carrier substrate 136 may provide protection for the various features (such as the light sensing region 106) formed on the front surface 148A of the semiconductor substrate 104. The carrier substrate 136 may also provide mechanical strength and support for processing the back surface 148B of the semiconductor substrate 104. For example, the carrier substrate 136 may serve as a support substrate when a thinning process is performed to the back surface 148B to thin down the semiconductor substrate 104. The semiconductor substrate 104 may be thinned by using a chemical mechanical polishing (CMP) process, a grinding process, an etching process, other applicable processes, or a combination thereof.

In some embodiments, the image sensor device 100 includes a doped layer 138 formed at the back surface 104B of the semiconductor substrate 104. The doped layer 138 may repair the back surface 148B damaged during the thinning process on the back surface 148B to reduce dark current and white pixels. The doped layer 138 may be formed by using an implantation process, diffusion process, annealing process, or a combination thereof. In some embodiments, the doped layer 138 is p-type doped. The doped layer 138 extends into the semiconductor substrate 104 from the back surface 104B of the semiconductor substrate 104.

As shown in FIG. 6, the image sensor device 100 includes an antireflective layer 140, a filter 142 (such as a color filter), and a lens 144 formed over the back surface 148B, in accordance with some embodiments. In an operation according to some embodiments, the image sensor device 100 is designed to receive a radiation 146 traveling towards the back surface 148B of the semiconductor substrate 104. The lens 144 directs the incident radiation 146 to the filter 142. Afterwards, the incident radiation 146 passes from the filter 142 through the antireflective layer 140 to the semiconductor substrate 104 and the corresponding light sensing region 106.

Figure 7:
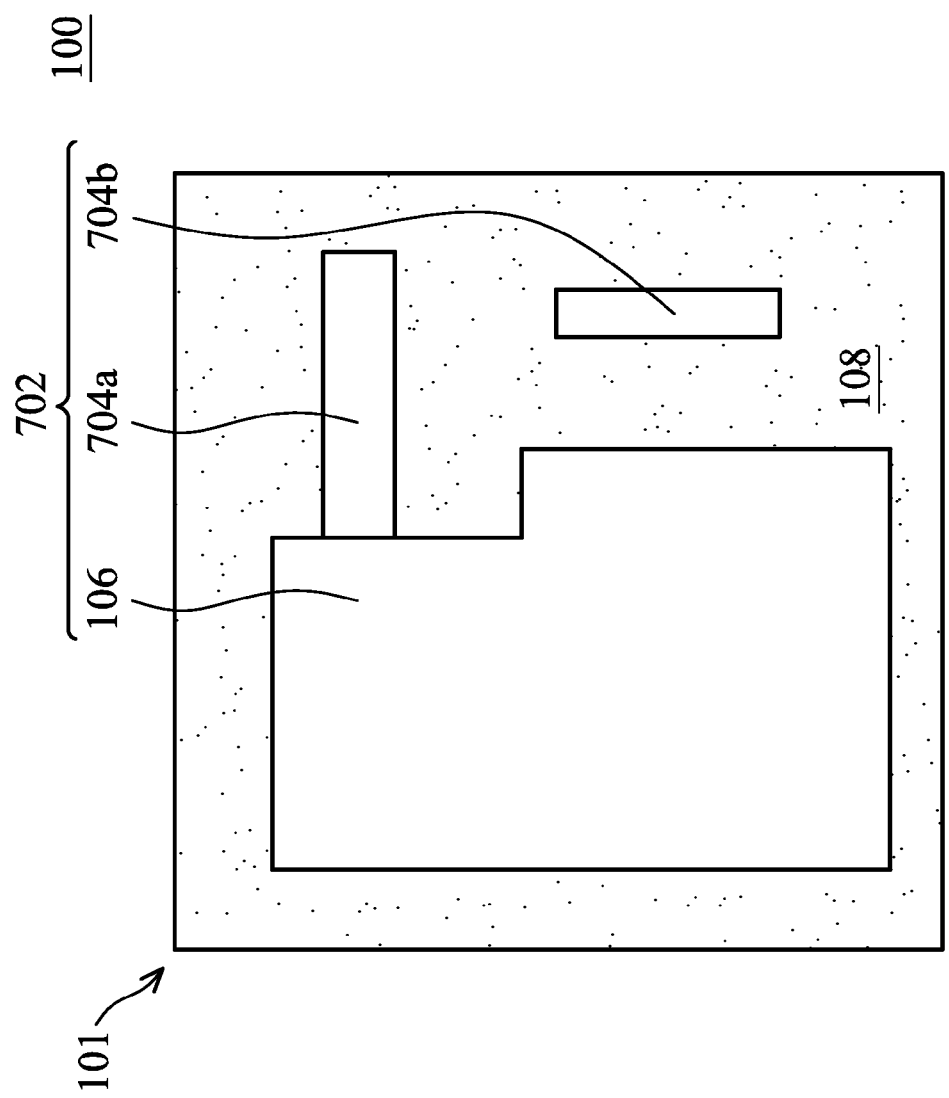
FIG. 7 is a top view of a pixel region of an image sensor device, in accordance with some embodiments.

As mentioned above, after the planarization process for forming the isolation structure 108, defects such as dislocations may be formed in the active region surrounded by the isolation structure 108. FIG. 7 is a top view of an image sensor device 100, in accordance with some embodiments. In FIG. 7, the gate stacks and the conductive feature are not shown for simplicity and clarity.

Referring to FIGS. 6 and 7, the isolation structure 108 surrounds and defines an active region 702 in the semiconductor substrate 104, in accordance with some embodiments. In some embodiments, the active region 702 includes the light sensing region 106 and doped regions 704a and 704b. In some embodiments, the doped region 704a connects with the light sensing region 106. The doped region 704b may be separated from the light sensing region 106 by the isolation structure 108.

In some embodiments, the doped region 704a includes the channel region 610 and a source/drain region (the doped region 120) of the transfer transistor 110, as shown in FIGS.

6 and 7. In some embodiments, the doped region 704a further includes the channel region 612 and a source/drain region (a portion of the doped region 120 or the doped region 118A) of the reset transistor 112.

As shown in FIGS. 5 and 7, the doped region 704b includes source/drain regions and a channel region of the source-follower transistor 114, in accordance with some embodiments. In some embodiments, the doped region 704b further includes source/drain regions and a channel region of the select transistor 116.

Figure 8:
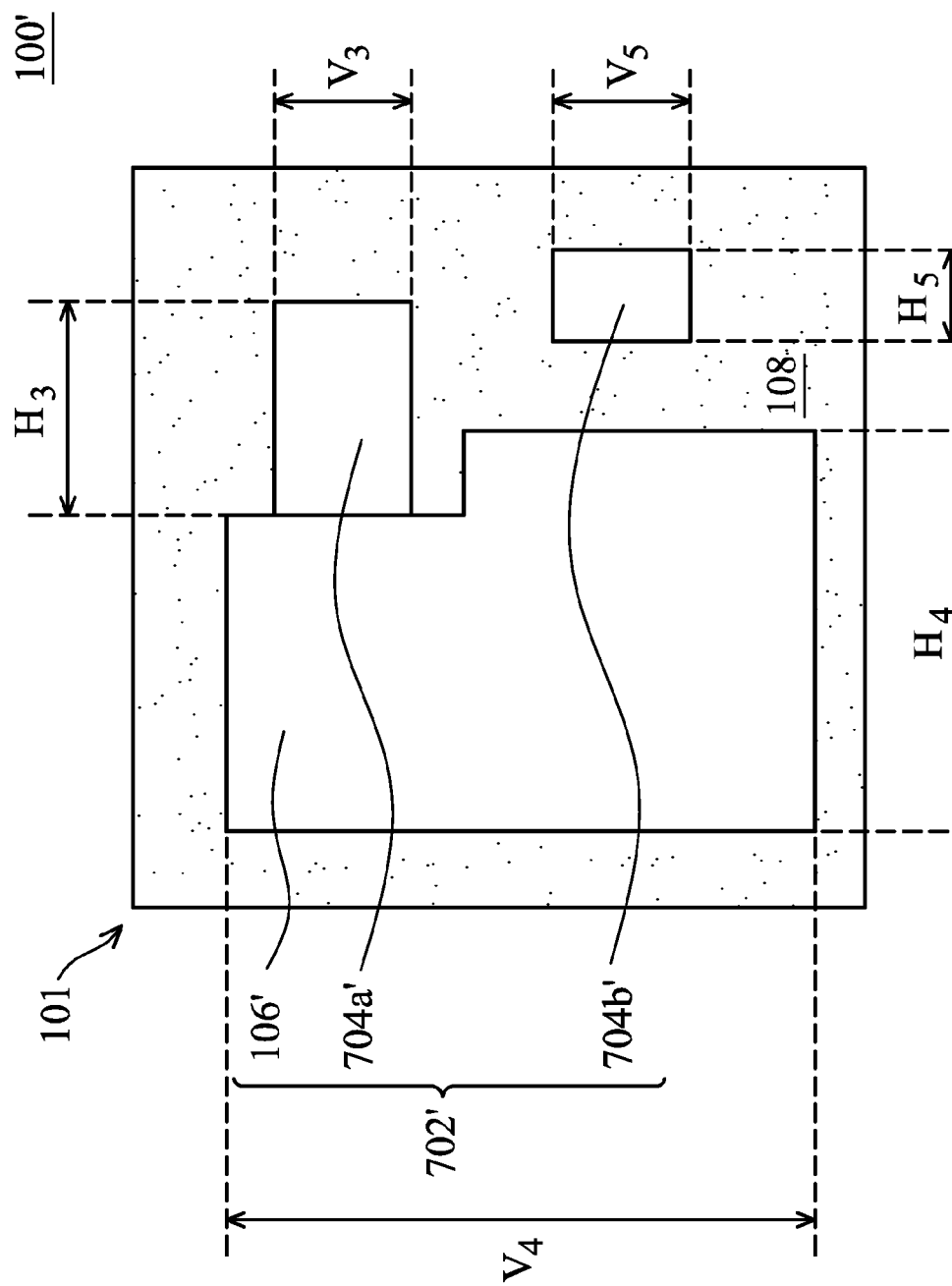
FIG. 8 is a top view of a pixel region of an image sensor device, in accordance with some embodiments.

In some embodiments, the shapes and/or the profiles of the active region 702 are modified to reduce or prevent defects (such as dislocations) from forming. FIG. 8 is a top view of the image sensor device 100', in accordance with some embodiments. In FIG. 8, the gate stacks and the conductive feature are not shown for simplicity and clarity.

As shown in FIG. 8, the active region 702 includes a light sensing region 106' and doped regions 704a' and 704b', in accordance with some embodiments. In some embodiments, the light sensing region 106' and the doped regions 704a' and 704b' are similar to the light sensing region 106 and the doped regions 704a and 704b as shown in FIG. 6. The isolation structure 108 surrounds the light sensing region 106' and the doped regions 704a' and 704b'.

Referring to FIGS. 6 and 8, the doped region 704a' includes the channel region 610 and a source/drain region (the doped region 120) of the transfer transistor 110, in accordance with some embodiments. In some embodiments, the doped region 704a' further includes the channel region 612 and a source/drain region (a portion of the doped region 120 or the doped region 118A) of the reset transistor 112.

In some embodiments, the shape and the profile of the doped region 704a' are modified to reduce or prevent defects (such as dislocations) from forming in the doped region 704a'. As shown in FIG. 8, the doped region 704a' has a length $H_3$ along a first direction and a length $V_3$ along a second direction. In some embodiments, the first direction and the second direction are substantially perpendicular to each other. For example, the first direction is parallel to a horizontal axis X, and the second direction is parallel to a vertical axis Y. Therefore, the lengths $H_3$ and $V_3$ are also called a horizontal length and a vertical length, respectively. However, it should be appreciated that the lengths H3 and V3 are not limited to being parallel to the horizontal axis X and the vertical axis Y, respectively. In some embodiments, the length $H_3$ is a maximum length of the doped region 704a' along the first direction, and the length $V_3$ is a maximum length of the doped region 704a' along the second direction.

The doped region 704a' may be rectangular in shape or substantially rectangular in shape. In some embodiments, the length $H_3$ is greater than the length $V_3$. In some other embodiments, the length $H_3$ is substantially equal to the length $V_3$. In these cases, the doped region 704a' is square (or substantially square) in shape.

In some embodiments, a ratio of the length $H_3$ to the length $V_3$ ($H_3/V_3$) is in a suitable range to prevent dislocations from forming in the doped region 704a'. The ratio of the length $H_3$ to the length $V_3$ ($H_3/V_3$) may be in a range from about 1 to about 4. In some other embodiments, the ratio ($H_3/V_3$) is about 5. Therefore, the bending moment, caused during the planarization process for forming the isolation structure 108, is significantly reduced. There is no unacceptable stress concentrated at a middle region of the doped region 704a'. Defects such as dislocation are reduced or prevented from forming in the doped region 704a'. Therefore, dark current is significantly reduced. The quality and performance of the image sensor device 100' are improved accordingly.

As shown in FIGS. 5 and 8, the doped region 704b' includes source/drain regions and a channel region of the source-follower transistor 114, in accordance with some embodiments. In some embodiments, the doped region 704b further includes source/drain regions and a channel region of the select transistor 116. Similarly, the shape and the profile of the doped region 704b' may be modified to reduce dark current from occurring in the image sensor device 100'.

As shown in FIG. 8, the doped region 704b' has a length $V_5$ along a third direction and a length $H_5$ along a fourth direction. In some embodiments, the third direction and the fourth direction are substantially perpendicular to each other. For example, the third direction is parallel to a vertical axis Y, and the fourth direction is parallel to a horizontal axis X. Therefore, the lengths $H_5$ and $V_5$ are also called a horizontal length and a vertical length, respectively. However, it should be noted that the third direction and the fourth direction are not limited to being parallel to the vertical axis Y and the horizontal axis X, respectively. In some embodiments, the length $H_5$ is a maximum length of the doped region 704b' along the fourth direction, and the length $V_5$ is a maximum length of the doped region 704b' along the third direction. In some embodiments, a ratio of the length $V_5$ to the length $H_5$ ($V_5/H_5$) is in a suitable range to prevent dislocations from forming in the doped region 704b'. The ratio of the length $V_5$ to the length $H_5$ ($V_5/H_5$) may be in a range from about 1 to about 4. In some other embodiments, the ratio ($V_5/H_5$) is about 5.

In some embodiments, the shape and the profile of the light sensing region 106' are modified to prevent dark current from occurring in the image sensor device 100'. As shown in FIG. 8, the light sensing region 106' has a length $H_4$ and a length $V_4$. In some embodiments, the length $H_4$ and the length $V_4$ are respectively along two directions which are substantially perpendicular to each other. In some embodiments, the length $H_4$ and the length $V_4$ are maximum lengths along the two directions, respectively. In some embodiments, the length $H_4$ is parallel to the horizontal axis X, and the length $V_4$ is parallel to the vertical axis Y. In some embodiments, a ratio of the length $V_4$ to the length $H_4$ ($V_4/H_4$) is in a suitable range to prevent dislocations from forming in the light sensing region 106'. The ratio of the length $V_4$ to the length $H_4$ ($V_4/H_4$) may be in a range from about 1 to about 4. In some other embodiments, the ratio ($V_4/H_4$) is about 5.

Embodiments of mechanisms for forming an image sensor device are provided. Shapes and profiles of an active region of the image sensor device are modified. The active region includes a light sensing region, doped regions for transistors, or a combination thereof. A first length, such as a horizontal length, and a second length, such as a vertical length, of the active region are modified such that a ratio of the first length to the second length is in a range from about 1 to about 4. Therefore, there would be no unacceptable stress concentrated at the active region during a planarization process for forming an isolation structure in the image sensor device. Defects, such as dislocations, are prevented from forming in the active region since no high bending moment is applied on the active region. As a result, dark current and white pixel defects of the image sensor device are significantly reduced. The performance and reliability of the image sensor device are greatly improved.

In accordance with some embodiments, an image sensor device is provided. The image sensor device includes a semiconductor substrate and an isolation structure in the semiconductor substrate. The image sensor device also includes an active region in the semiconductor substrate and surrounded by the isolation structure. The active region includes a light sensing region and a doped region, and the doped region has a horizontal length and a vertical length. A ratio of the horizontal length to the vertical length is in a range from about 1 to about 4.

In accordance with some embodiments, an image sensor device is provided. The image sensor device includes a semiconductor substrate and an isolation structure in the semiconductor substrate. The image sensor device also includes an active region in the semiconductor substrate and surrounded by the isolation structure. The active region includes a light sensing region and a doped region. The doped region has a first maximum length along a first direction and a second maximum length along a second direction substantially perpendicular to the first direction. A ratio of the first maximum length to the second maximum length is in a range from about 1 to about 4.

In accordance with some embodiments, an image sensor device is provided. The image sensor device includes a semiconductor substrate and an isolation structure in the semiconductor substrate. The image sensor device also includes a light sensing region in the semiconductor substrate and surrounded by the isolation structure. The light sensing region has a first maximum length along a first direction and a second maximum length along a second direction substantially perpendicular to the first direction. A ratio of the first maximum length to the second maximum length is in a range from about 1 to about 4.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An image sensor device, comprising:
   a semiconductor substrate;
   an isolation structure in the semiconductor substrate; and
   an active region in the semiconductor substrate and surrounded by the isolation structure, wherein the active region comprises a light sensing region and a doped region, the doped region is outside of the light sensing region and has a horizontal length and a vertical length, and a ratio of the horizontal length to the vertical length is in a range from about 1 to about 4,
   wherein the doped region comprises a channel region and a source/drain region of a transfer transistor, and the source/drain region of the transfer transistor serves as a floating diffusion region of the image sensor device.

2. The image sensor device as claimed in claim 1, wherein a part of the light sensing region serves as a drain/source region of the transfer transistor.

3. The image sensor device as claimed in claim 2, wherein the doped region further comprises a second channel region and a second source/drain region of a reset transistor.

4. The image sensor device as claimed in claim 3, wherein the light sensing region is contact with the doped region.

5. The image sensor device as claimed in claim 1, wherein the light sensing region has a second vertical length and a second horizontal length, and a ratio of the second vertical length to the second horizontal length is in a range from about 1 to about 4.

6. The image sensor device as claimed in claim 1, further comprising a second doped region in the semiconductor substrate and surrounded by the isolation structure, wherein the second doped region has a third vertical length and a third horizontal length, and a ratio of the third vertical length to the third horizontal length is in a range from about 1 to about 4.

7. The image sensor device as claimed in claim 6, wherein the second doped region is separated from the doped region or the light sensing region by the isolation structure.

8. The image sensor device as claimed in claim 6, wherein the second doped region comprises source/drain regions and a channel region of a source-follower transistor.

9. The image sensor device as claimed in claim 8, wherein the second doped region further comprises second source/drain regions and a second channel region of a select transistor.

10. The image sensor device as claimed in claim 1, wherein the isolation structure comprises silicon oxide, silicon nitride, silicon oxynitride, or a combination thereof.

11. An image sensor device, comprising:
    a semiconductor substrate;
    an isolation structure in the semiconductor substrate; and
    an active region in the semiconductor substrate and surrounded by the isolation structure, wherein the active region comprises a light sensing region and a doped region, the doped region is outside of the light sensing region and has a first maximum length along a first direction and a second maximum length along a second direction substantially perpendicular to the first direction, and a ratio of the first maximum length to the second maximum length is in a range from about 1 to about 4,
    wherein the doped region comprises a channel region and a source/drain region of a transfer transistor, and the source/drain region of the transfer transistor serves as a floating diffusion region of the image sensor device.

12. The image sensor device as claimed in claim 11, wherein the light sensing region is in contact with the doped region.

13. The image sensor device as claimed in claim 11, further comprising a second doped region in the semiconductor substrate and separated from the light sensing region or the doped region by the isolation structure.

14. The image sensor device as claimed in claim 13, wherein the second doped region has a third maximum length along a third direction and a fourth maximum length along a fourth direction substantially perpendicular to the third direction, and a ratio of the third maximum length to the fourth maximum length is in a range from about 1 to about 4.

15. The image sensor device as claimed in claim 11, wherein the light sensing region has a third maximum length along a third direction and a fourth maximum length along a fourth direction substantially perpendicular to the third direction, and a ratio of the third maximum length to the fourth maximum length is in a range from about 1 to about 4.

16. An image sensor device, comprising:
   a semiconductor substrate;
   an isolation structure in the semiconductor substrate;
   a light sensing region in the semiconductor substrate and surrounded by the isolation structure, wherein the light sensing region has a first maximum length along a first direction and a second maximum length along a second direction substantially perpendicular to the first direction, and a ratio of the first maximum length to the second maximum length is in a range from about 1 to about 4; and
   a doped region in the semiconductor substrate and connected with the light sensing region, wherein the doped region is outside of the light sensing region and has a third maximum length along the second direction and a fourth maximum length along the first direction, and wherein a ratio of the third maximum length to the fourth maximum length is in a range from about 1 to about 4,
   wherein the doped region comprises a channel region and a source/drain region of a transfer transistor, and the source/drain region of the transfer transistor serves as a floating diffusion region of the image sensor device.

17. The image sensor device as claimed in claim 16, wherein a part of the light sensing region serves as a drain/source region of the transfer transistor.

18. The image sensor device as claimed in claim 16, further comprising a second doped region in the semiconductor substrate and separated from the light sensing region by the isolation structure, wherein the second doped region has a fifth maximum length along the first direction and a sixth maximum length along the second direction, and wherein a ratio of the fifth maximum length to the sixth maximum length is in a range from about 1 to about 4.

19. The image sensor device as claimed in claim 16, further comprising a second doped region in the semiconductor substrate and separated from the light sensing region by the isolation structure, wherein the second doped region has a fifth maximum length along a third direction and a sixth maximum length along a fourth direction, and wherein a ratio of the fifth maximum length to the sixth maximum length is in a range from about 1 to about 4.

20. The image sensor device as claimed in claim 16, wherein the doped region further comprises a second channel region and a second source/drain region of a reset transistor.

* * * * *